(12) United States Patent
Son et al.

(10) Patent No.: US 7,714,455 B2
(45) Date of Patent: May 11, 2010

(54) SEMICONDUCTOR PACKAGES AND METHODS OF FABRICATING THE SAME

(75) Inventors: Joon-seo Son, Seoul (KR); O-soeb Jeon, Seoul (KR)

(73) Assignee: Fairchild Korea Semiconductor Ltd., Buchon, Kyungki-do (KR)

( * ) Notice: Subject to any disclaimer, the term of this patent is extended or adjusted under 35 U.S.C. 154(b) by 0 days.

(21) Appl. No.: 12/260,963

(22) Filed: Oct. 29, 2008

(65) Prior Publication Data

US 2009/0115038 A1 May 7, 2009

(30) Foreign Application Priority Data

Nov. 5, 2007 (KR) .................. 10-2007-0112312

(51) Int. Cl.
*H01L 23/28* (2006.01)
(52) U.S. Cl. .................. 257/787; 257/796; 438/127
(58) Field of Classification Search .......... 257/787, 257/796, 676, 697, 706, 707; 438/112, 122, 438/123, 124, 127
See application file for complete search history.

(56) References Cited

U.S. PATENT DOCUMENTS

| 6,303,860 | B1 * | 10/2001 | Van Rens et al. | 174/521 |
| 6,882,041 | B1 * | 4/2005 | Cheah et al. | 257/704 |
| 7,145,253 | B1 * | 12/2006 | Kim et al. | 257/790 |
| 7,166,926 | B2 * | 1/2007 | Hayashi et al. | 257/787 |

\* cited by examiner

*Primary Examiner*—S. V Clark
(74) *Attorney, Agent, or Firm*—Townsend and Townsend and Crew LLP

(57) ABSTRACT

Provided are semiconductor packages and methods of fabricating the same. An exemplary semiconductor package includes a die pad including a dimple filled with an insulating material in an upper surface or a lower surface thereof. A semiconductor chip is mounted on the upper surface of the first die pad. A package body encapsulates the first die pad and the first semiconductor chip and includes a pinhole. A bottom surface of the pinhole terminates at the insulating material.

20 Claims, 8 Drawing Sheets

SEMICONDUCTOR PACKAGES AND METHODS OF FABRICATING THE SAME

CROSS-REFERENCES TO RELATED APPLICATIONS

This application claims the benefit of Korean Patent Application No. 10-2007-0112312, filed on Nov. 5, 2007, in the Korean Intellectual Property Office, the disclosure of which is incorporated herein in its entirety by reference.

BACKGROUND OF THE INVENTION

1. Field of the Invention

The present invention relates to semiconductor packages and methods of fabricating the same, and more particularly, to semiconductor packages, each of which includes a semiconductor chip and a die pad encapsulated by a package body, and methods of fabricating such semiconductor packages.

2. Description of the Related Art

Fabrication of a semiconductor package typically involves mounting a semiconductor chip on an upper surface of a die pad included in a lead frame and forming a package body to encapsulate the semiconductor chip and the die pad.

When the semiconductor chip is a highly integrated chip or a power circuit chip for controlling high power, a large amount of heat may be generated by the semiconductor chip. In order to dissipate the heat outside of the semiconductor chip, a heat sink may be installed on a lower surface of the package body (i.e., on a lower surface of the die pad). In this case, a distance between the lower surface of the die pad and the heat sink must be maintained constant so as to improve a heat dissipation characteristic.

Accordingly, a support pin for applying pressure to the die pad may be used in order to prevent the die pad from bending during the encapsulation process. However, after the encapsulation process is finished, when the support pin is removed, a pinhole may be formed in the package body to expose the die pad. Thus, the pinhole is filled with insulating resin in order to externally insulate the die pad exposed in the pinhole.

However, since the pinhole has a high aspect ratio, when the insulating resin is filled in the pinhole, a void may be easily formed. In this case, it is difficult to insulate the die pad from external air. Also, a very large amount of insulating resin is required to fill the entire pinhole.

BRIEF SUMMARY OF THE INVENTION

Aspects of the present invention provide semiconductor packages in which, even if a pinhole is formed in a package body, a die pad within the package can have an excellent insulation characteristic.

According to an aspect of the present invention, there is provided a semiconductor package including a die pad. The die pad includes a dimple filled with an insulating material in an upper surface or a lower surface thereof. A semiconductor chip is mounted on the upper surface of the first die pad. A package body encapsulates the first die pad and the first semiconductor chip and includes a pinhole. A bottom surface of the pinhole terminates at the insulating material.

According to another aspect of the present invention, there is provided a semiconductor package including a die pad. The die pad includes an upper dimple filled with a first insulating material in an upper surface thereof and a lower dimple filled with a second insulating material in a lower surface thereof. A semiconductor chip is mounted on the upper surface of the die pad and spaced apart from the upper dimple. A package body encapsulates the die pad and the semiconductor chip and includes an upper pinhole adjacent to the upper surface of the die pad and a lower pinhole adjacent to the lower surface of the die pad. A bottom surface of the upper pinhole terminates at the first insulating material, and a bottom surface of the lower pinhole terminates at the second insulating material.

According to yet another aspect of the present invention, there is provided a semiconductor package including a die pad. The die pad includes an internal heat sink and an interconnection layer. A dimple is filled with an insulating material in the interconnection layer. A semiconductor chip is mounted on an upper surface of the die pad and spaced apart from the dimple. A package body encapsulates the die pad and the semiconductor chip and includes a pinhole adjacent to the upper surface of the die pad. A bottom surface of the pinhole terminates at the insulating material, and the internal heat sink has an exposed portion that is not covered by the package body.

According to still another aspect of the present invention, there is provided a method of fabricating a semiconductor package. The method includes forming a dimple filled with an insulating material in an upper surface or a lower surface of a die pad. A first semiconductor chip is mounted on the upper surface of the die pad. The die pad is disposed in a mold including a support pin such that an end surface of the support pin terminates at the insulating material. An encapsulant is injected into the mold to form a package body that encapsulates the first semiconductor chip and the first die pad. The package body and the mold, including the support pin, are separated from one another to form a pinhole in the package body that corresponds to the support pin of the mold.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
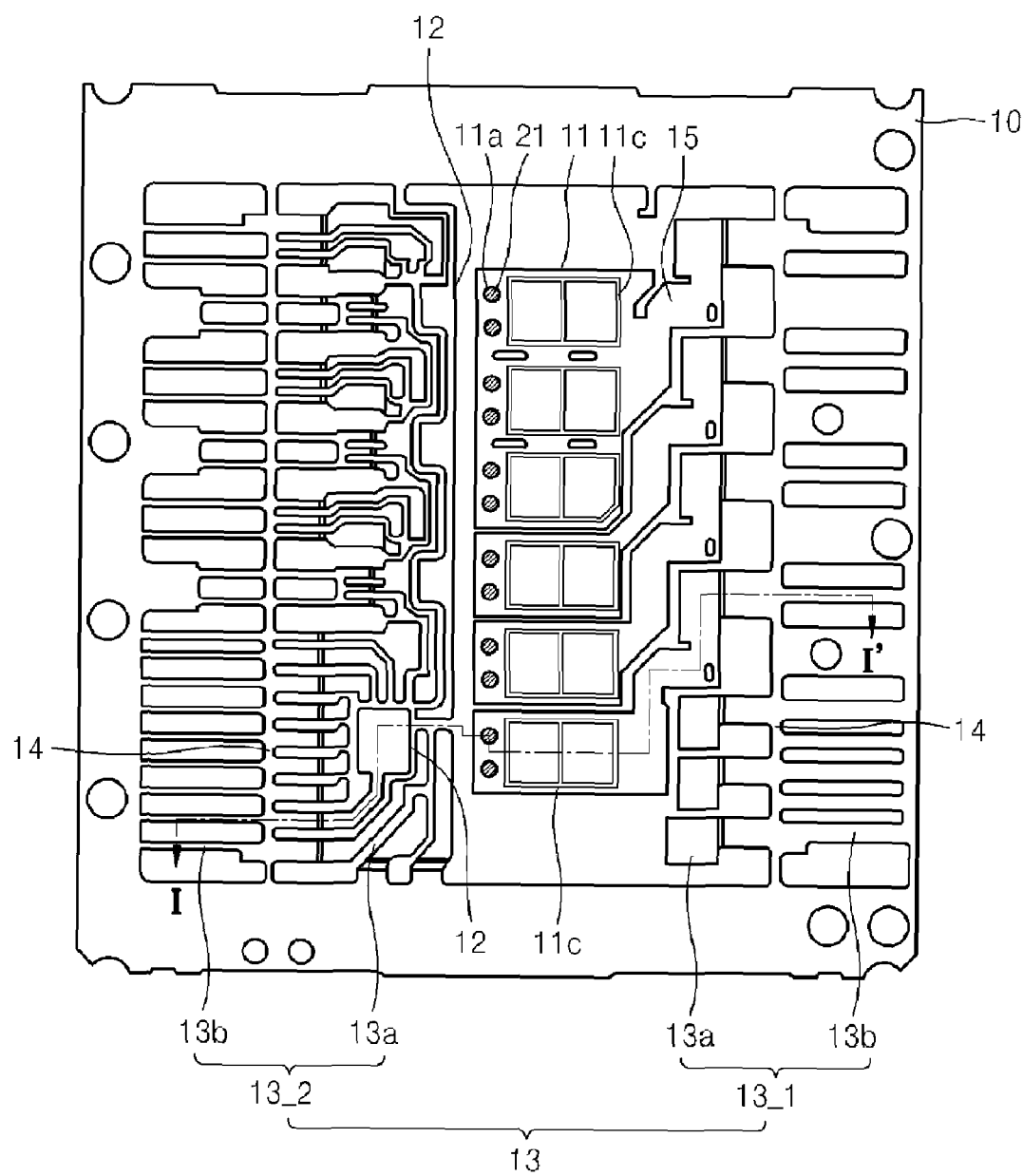
FIGS. 1A through 1C are plan views illustrating a method of fabricating a semiconductor package according to an embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. It will also be understood that when a layer is referred to as being "on" another layer or substrate, it can be directly on the other layer, or substrate or intervening layers may also be present. In the drawings, the thicknesses of layers and regions are exaggerated for clarity. The same reference numerals are used to denote the same elements throughout the specification. The term "and/or" used herein includes any and all combinations of one or more of the associated listed items.

Like reference numerals refer to like elements throughout the description. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

It will be understood that, although the terms first and second are used herein to describe various members, devices, regions, layers, and/or sections, the members, devices, regions, layers and/or sections should not be limited by these terms. These terms are only used to distinguish one member, device, region, layer or section from another member, device, region, layer or section. Thus, for example, a first member, device, region, layer, or section discussed below could be termed a second member, device, region, layer, or section without departing from the teachings of the present invention.

Figure 1B:
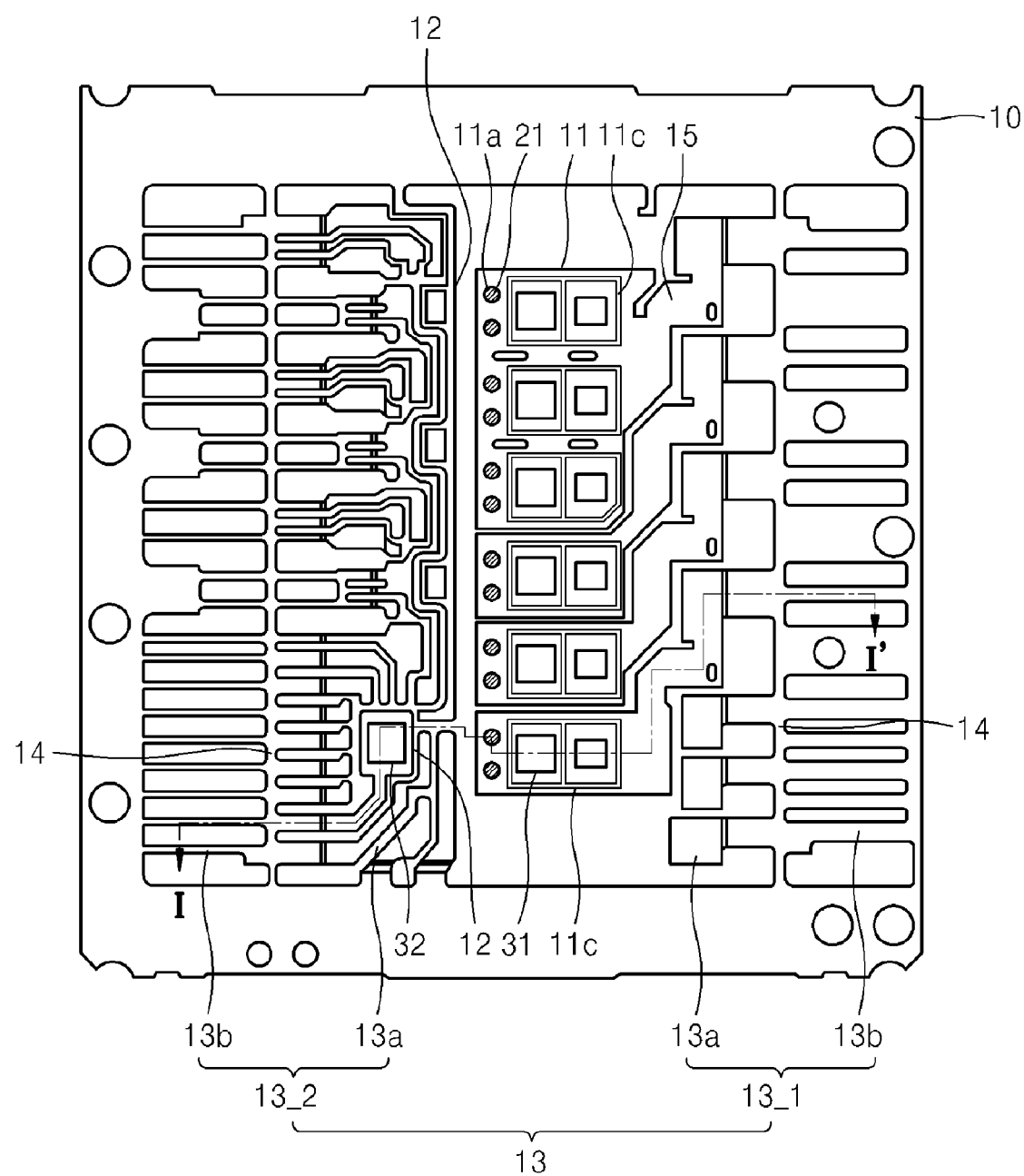
Figure 1C:
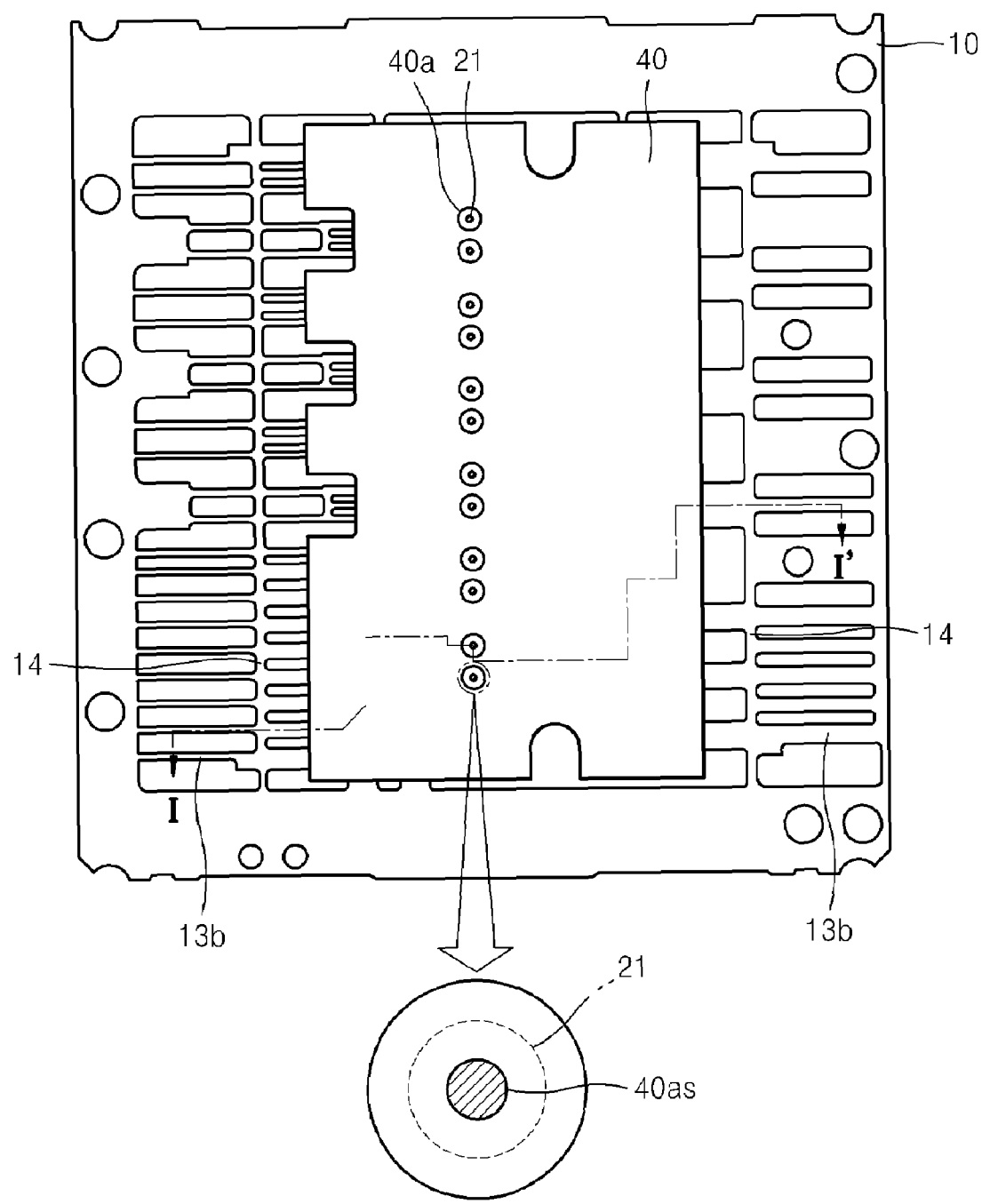
Figure 2A:
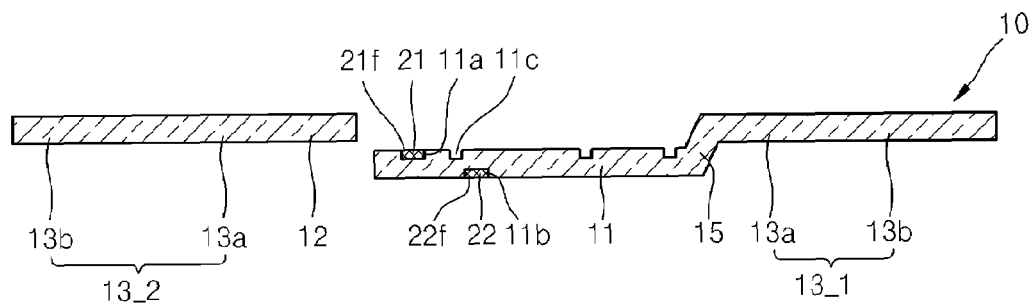
FIGS. 2A through 2E are cross-sectional views illustrating a method of fabricating a semiconductor package according to an embodiment of the present invention.
Figure 2B:
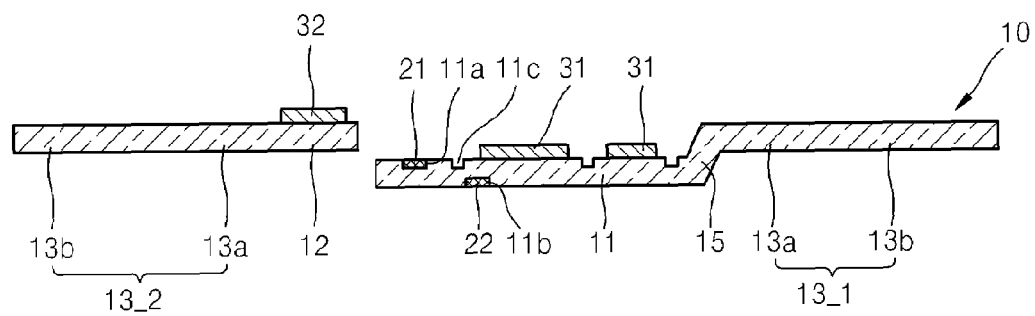
Figure 2C:
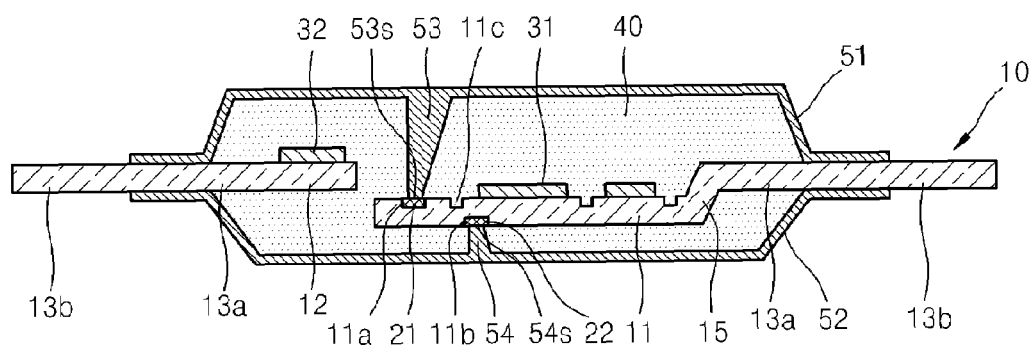
Figure 2D:
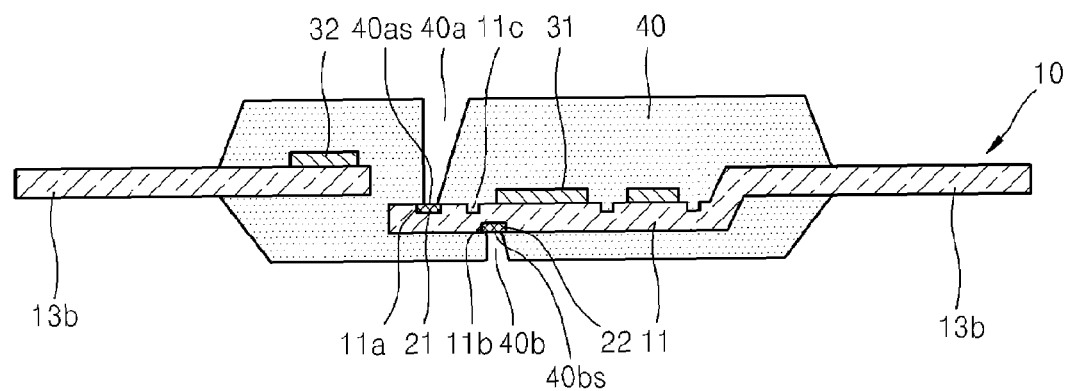

FIGS. 1A through 1C are plan views illustrating a method of fabricating a semiconductor package according to an embodiment of the present invention, and FIGS. 2A through 2E are cross-sectional views illustrating a method of fabricating a semiconductor package according to an embodiment of the present invention. In particular, FIGS. 2A, 2B, and 2D are cross-sectional views taken along lines I-I' of FIGS. 1A, 1B, and 1C, respectively.

Referring to FIGS. 1A and 2A, a lead frame 10 is provided. The lead frame 10 includes at least one first die pad 11 disposed at the center thereof and a plurality of leads 13 disposed around the first die pad 11.

Each of the leads 13 may include an internal lead 13a and an external lead 13b that extends from the internal lead 13a. External leads 13b may be connected to one another by dam bars 14. The leads 13 may be disposed on both sides of the first die pad 11. In this case, leads disposed on one side of the first die pad 11 may be power leads 13_1 for inputting or outputting power, and leads disposed on the other side of the first die pad 11 may be data leads 13_2 for inputting and outputting data. The width of the power lead 13_1 may be greater than that of the data lead 13_2. Also, a second die pad 12 may be disposed adjacent to the first die pad 11 and the data leads 13_2.

The first die pad 11 may be disposed at a lower level than the leads 13. Also, the first die pad 11 may be connected to the leads 13 (specifically, the power leads 13_1) by connection bars 15.

The first die pad 11 has an upper surface and a lower surface. The upper surface of the first die pad 11 includes a chip region and a peripheral region adjacent to the chip region. A dimple is formed in the upper surface or lower surface of the first die pad 11. Specifically, an upper dimple 11a is formed in the peripheral region of the upper surface of the first die pad 11. When a plurality of first die pads 11 are provided, the upper dimple 11a may be formed in each of the first die pads 11. Further, a plurality of upper dimples 11a may be formed in the upper surface of one first die pad 11.

Figure 4:
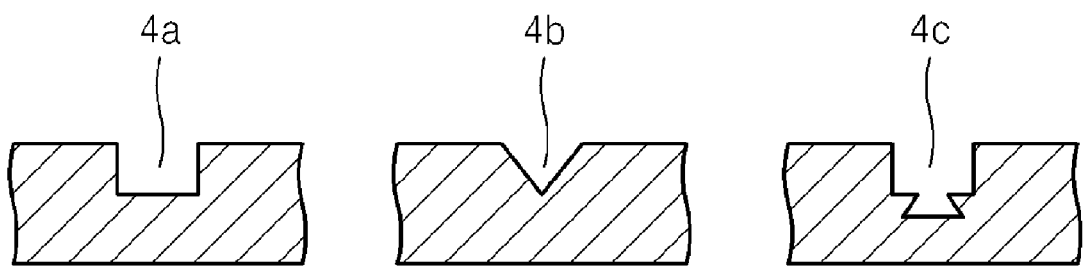
FIG. 4 is a cross-sectional view of various shapes of a dimple according to embodiments of the present invention.

A lower dimple 11b may be formed in the lower surface of the first die pad 11. When a plurality of first die pads 11 are provided, the lower dimple 11b may be formed in each of the first die pads 11. Further, a plurality of lower dimples 11b may be formed in the lower surface of one first die pad 11. The upper dimples 11a and the lower dimples 11b may be arranged in offset positions so that an upper dimple 11a is not directly over a lower dimple 11b. As illustrated in FIG. 4, the sectional shape of each of the upper and lower dimples 11a and 11b may comprise a "U" shape 4a, a "V" shape 4b, a dovetail shape 4c, or any other type of shape. The formation of the upper and lower dimples 11a and 11b may be performed by wet etching using an etch mask, although the present invention is not limited thereto.

The upper dimple 11a and the lower dimple 11b are filled with a first insulating material 21 and a second insulating material 22, respectively. The insulating materials 21 and 22 may have outer surfaces 21f and 22f, which are at substantially the same level with the upper surface or lower surface of the first die pad 11. Each of the insulating materials 21 and 22 may comprise: epoxy resin, polyimide, and/or silicone. The insulating materials 21 and 22 may have the same composition or may have different compositions. The epoxy resin may comprise epoxy molding compound (EMC), and may further comprise an inorganic filler. The silicone may comprise silicone rubber. The insulating materials 21 and 22 may be highly adhesive to a package body that will be described later. The insulating materials 21 and 22 may be filled in the dimples 11a and 11b using a screen printing method, although the present invention is not limited thereto.

The insulating materials 21 and 22 may be cured. The curing of the insulating materials 21 and 22 may be performed by applying heat or ultraviolet (UV) rays to the insulating materials 21 and 22.

Before or after forming the dimples 11a and 11b filled with the insulating materials 21 and 22, a groove 11c may be formed between the chip region and the peripheral region. The groove 11c may be formed to enclose the chip region. Like the dimples 11a and 11b, the sectional shape of the groove 11c may comprise a U shape 4a, a V shape 4b, or a dovetail shape 4c as illustrated in FIG. 4, or another shape. However, the groove 11c is typically not filled with an insulating material unlike the dimples 11a and 11b.

Referring to FIGS. 1B and 2B, at least one first semiconductor chip 31 may be mounted on the chip region of the first die pad 11. The first semiconductor chip 31 may be spaced apart from the upper dimple 11a, and the groove 11c is formed between the semiconductor chip 31 and the upper dimple 11a.

During the mounting of the first semiconductor chip 31, the entire lower surface of the first die pad 11 may be placed in close contact with a work platform and maintained at the same level (e.g., maintained at a level position). More specifically, the lower insulating material 22 filled in the lower dimple 11b may not protrude from the lower surface of the first die pad 11, so that the first die pad 11 can be maintained at the same level during the mounting of the first semiconductor chip 31. Thus, occurrence of alignment errors can be prevented during the mounting of the first semiconductor chip 31.

The first semiconductor chip 31 may comprise a power circuit chip for converting or controlling power, such as a diode, a bipolar transistor, an insulated gate bipolar transistor (IGBT), or a power metal oxide semiconductor field effect transistor (power MOSFET).

A second semiconductor chip 32 may be mounted on the second die pad 12. The second semiconductor chip 32 may comprise a control circuit chip for controlling and driving the power circuit chip. When both a power circuit chip and a control circuit chip are mounted on the lead frame 10 as described above, a smart power module or an intelligent power module may be embodied.

A bonding pad (not shown) of the first semiconductor chip 31 may be electrically connected to some of the internal leads 13a by a first wire (not shown). When the first semiconductor chip 31 is a power circuit chip, the first wire may comprise an aluminum (Al) wire. A bonding pad (not shown) of the second semiconductor chip 32 may be electrically connected to some of the internal leads 13a by a second wire (not shown). When the second semiconductor chip 32 is a control circuit chip, the second wire may comprise a gold (Au) wire. Each of the first and second wires may comprise a wire bond, a ribbon bond, or other electrically conductive interconnect structure known to the art.

Referring to FIG. 2C, the lead frame 10 on which the semiconductor chips 31 and 32 are mounted is disposed in a mold. Specifically, the first and second die pads 11 and 12 on which the first and second semiconductor chips 31 and 32 are mounted are disposed between an upper mold 51 and a lower mold 52. The upper mold 51 and the lower mold 52 include a first support pin 53 and a second support pin 54 corresponding to the upper dimple 11a and the lower dimple 11b, respectively. An end surface 53s of the first support pin 53 contacts the first insulating material 21 and an end surface 54s of the second support pin 54 contacts the second insulating material 22 so that the first die pad 11 is supported by the support pins 53 and 54.

The end surface 53s of the first support pin 53 terminates at the first insulating material 21, specifically, at the outer surface 21f of the first insulating material 21. Similarly, the end surface 54s of the second support pin 54 terminates at the second insulating material 22, specifically, at the outer surface 22f of the second insulating material 22. Thus, the first insulating material 21 may be exposed around the end surface 53s of the first support pin 53, and the second insulating material 22 may be exposed around the end surface 54s of the second support pin 54.

When the first die pad 11 is supported by the first and second support pins 53 and 54, an encapsulant, such as EMC, is injected into a cavity between the upper mold 51 and the lower mold 52. Thereafter, the injected encapsulant is cured, thereby forming a package body 40 that encapsulates not only the first and second semiconductor chips 31 and 32 and the first and second die pads 11 and 12 but also the internal leads 13a. During this encapsulation process, the support pins 53 and 54 vertically support the first die pad 11 under pressure, so that the first die pad 11 can be maintained at a level position. As a result, the package body 40 can be formed on the upper and lower surfaces of the first die pad 11 at a uniform thickness. The package body 40 also may be filled in the groove 11c.

Referring to FIGS. 1C and 2D, the upper and lower molds 51 and 52 and the first and second support pins 53 and 54 included therein are removed from the package body 40. Thus, an upper pinhole 40a and a lower pinhole 40b are formed in the package body 40 to expose portions of the first and second insulating materials 21 and 22, respectively. Portions of the external leads 13b protrude outside the package body 40.

The upper and lower pinholes 40a and 40b are formed to correspond to the first and second support pins 53 and 54, respectively. Furthermore, the pinholes 40a and 40b may have substantially the same shapes as the support pins 53 and 54, respectively. A bottom surface 40as of the upper pinhole 40a may terminate at the first insulating material 21, and a bottom surface 40bs of the lower pinhole 40b may terminate at the second insulating material 22. In this case, the insulating materials 21 and 22 enclose the bottom surfaces 40as and 40bs of the pinholes 40a and 40b, respectively. Thus, only the insulating materials 21 and 22, but not the first die pad 11, are exposed in the pinholes 40a and 40b. As a result, the first die pad 11 can be externally insulated by the insulating materials 21 and 22, although the pinholes 40a and 40b are formed. Also, the insulating materials 21 and 22 can protect the first semiconductor chip 31 from moisture and oxygen contained in the external air. Furthermore, the groove 11c, which is formed in the first die pad 11 interposed between the upper dimple 11a and the first semiconductor chip 31, increases the penetration path for the moisture and oxygen, thus protecting the first semiconductor chip 31.

Figure 2E:
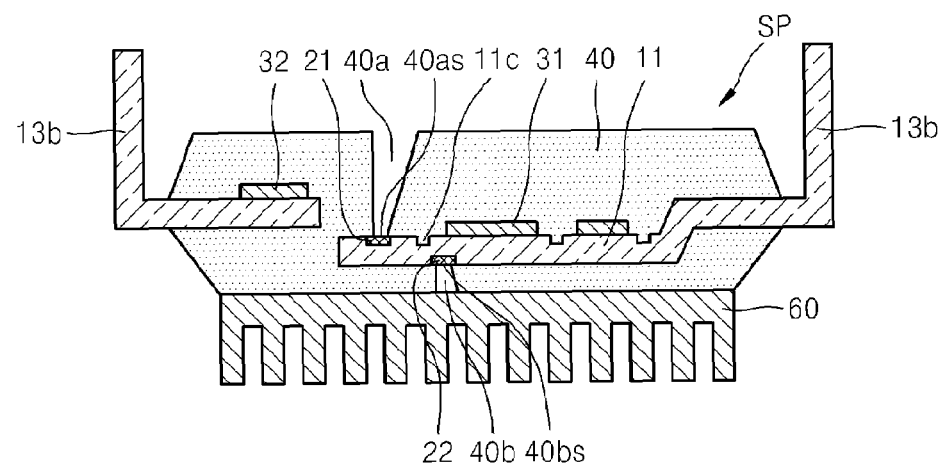

Referring to FIG. 2E, a trimming process of removing the dam bars (14 of FIG. 1C) of the lead frame 10 is performed to leave only the external leads 13b outside the package body 40. Thereafter, a forming process of bending the external leads 13b is performed, thereby completing fabrication of a semiconductor package SP.

A heat sink 60 may be installed adjacent to the package body 40 over the lower surface of the first die pad 11. The heat sink 60 serves to dissipate heat generated by the first semiconductor chip 31 mounted on the first die pad 11. In this case, the package body 40 is formed on the lower surface of the first die pad 11 to a uniform thickness, so that a distance between the lower surface of the first die pad 11 and the heat sink 60 can be maintained uniform. As a result, the semiconductor package SP can have good heat dissipation characteristics. Also, since the first die pad 11 is not exposed in the lower pinhole 40b because of the presence of the second insulating material 22, the first die pad 11 can be well insulated from the heat sink 60.

FIGS. 3A through 3E are cross-sectional views illustrating a method of fabricating a semiconductor package according to another embodiment of the present invention. The method of fabricating a semiconductor package according to the current embodiment is generally the same as the method described with reference to FIGS. 2A through 2E except for the following description.

Figure 3A:
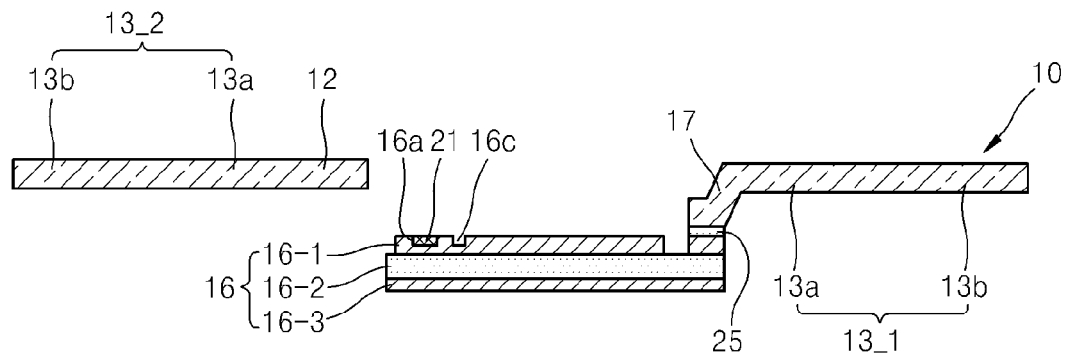
FIGS. 3A through 3E are cross-sectional views illustrating a method of fabricating a semiconductor package according to another embodiment of the present invention.

Referring to FIG. 3A, a lead frame 10 is provided. The lead frame 10 includes at least one first die pad 16 disposed at the center thereof and a plurality of leads disposed around the first die pad 16.

Each of the leads may include an internal lead 13a and an external lead 13b that extends from the internal lead 13a. Leads disposed on one side of the first die pad 16 may comprise power leads 13_1 for inputting or outputting power, and leads disposed on the other side of the first die pad 16 may comprise data leads 13_2 for inputting and outputting data. A second die pad 12 may be disposed adjacent to the first die pad 16 and the data leads 13_2.

The first die pad 16 may include an internal heat sink and an interconnection layer 16-1. The internal heat sink may include a base metal layer 16-3 and a base insulating layer 16-2. The base metal layer 16-3 may comprise a high thermal conductivity metal, such as aluminum (Al), an Al alloy, copper (Cu), or a Cu alloy. The base insulating layer 16-2 may comprise one or more ceramic materials, that latter of which includes metal oxides and metal nitrides. Exemplary metal oxides include $Al_2O_3$ and BeO, and exemplary metal nitrides include AlN and SiN. When the interconnection layer 16-1 comprises a Cu layer or a Cu alloy layer, a nickel (Ni) layer (not shown) and/or a gold (Au) layer (not shown) may be provided on the interconnection layer 16-1 in order to prevent oxidation of the interconnection layer 16-1.

The first die pad 16 may be located at a lower level than the leads. A connection bar 17 protruding from the power lead 13_1 may be connected to the interconnection layer 16-1 by a conductive adhesive 25.

The interconnection layer 16-1, which corresponds to an upper surface of the first die pad 16, includes a chip region and a peripheral region adjacent to the chip region. A dimple 16a is formed in the peripheral region of the interconnection layer 16-1. The dimple 16a is filled with an insulating material 21. An outer surface of the insulating material 21 may be at substantially the same level with an upper surface of the interconnection layer 16-1. The insulating material 21 may comprise: epoxy resin, polyimide, and/or silicone. The epoxy resin may comprise EMC, and may further comprise an inorganic filler. The silicone may comprise a silicone rubber. The insulating material 21 filled in the dimple 16a may be cured.

Before or after forming the dimple 16a, a groove 16c may be formed between the chip region and the peripheral region. The groove 16c may be formed to enclose the chip region.

Figure 3B:
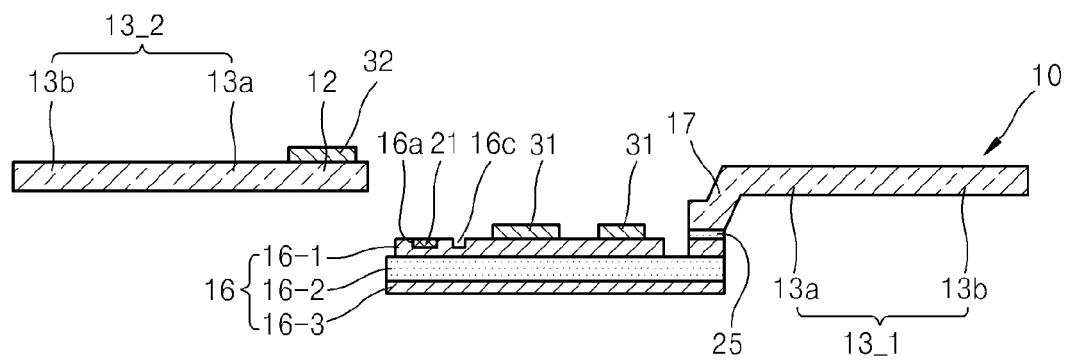

Referring to FIG. 3B, at least one first semiconductor chip 31 may be mounted on the chip region of the interconnection layer 16-1. During the mounting of the first semiconductor chip 31, the entire lower surface of the first die pad 16 may be placed in close contact with a work platform and maintained at the same level (e.g., maintained at a level position). The first semiconductor chip 31 may comprise a power circuit chip for converting or controlling power. A second semiconductor chip 32 may be mounted on the second die pad 12. The second semiconductor chip 32 may comprise a control circuit chip for controlling and driving the power circuit chip.

A bonding pad (not shown) of the first semiconductor chip 31 may be electrically connected to some of the internal leads 13a by a first wire (not shown). A bonding pad (not shown) of the second semiconductor chip 32 may be electrically connected to some of the internal leads 13a by a second wire (not shown). Each of the first and second wires may comprise a wire bond, a ribbon bond, or other electrically conductive interconnect structure known to the art.

Figure 3C:
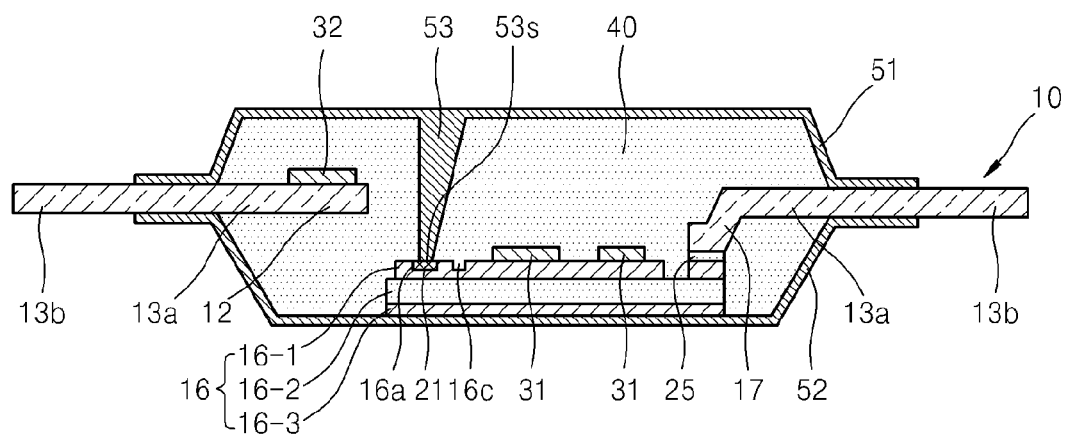

Referring to FIG. 3C, the lead frame 10 on which the semiconductor chips 31 and 32 are mounted is disposed between an upper mold 51 and a lower mold 52. In this case, the base metal layer 16-3 of the internal heat sink of the first die pad 16 is disposed on a bottom surface of the lower mold 52. The upper mold 51 includes a support pin 53 corresponding to the dimple 16-1. An end surface 53s of the support pin 53 contacts the outer surface of the insulating material 21. The lower mold 52 and the support pin 53 support the first die pad 16.

The end surface 53s of the support pin 53 terminates at the insulating material 21. Thus, the insulating material 21 may be exposed around the end surface 53s of the first support pin 53.

Thereafter, an encapsulant, such as EMC, is injected into a cavity between the upper mold 51 and the lower mold 52 and then cured, thereby forming a package body 40 that encapsulates not only the first and second semiconductor chips 31 and 32 and the first and second die pads 16 and 12 but also the internal leads 13a. During this encapsulation process, the support pin 53 applies downward pressure to the first die pad 16 so as to press the first die pad 16 against the lower mold 52. Thus, the injection of the encapsulant under the lower surface of the first die pad 16 (i.e., under the base metal layer 16-3) can be prevented. As a result, generation of a flash on a lower surface of the base metal layer 16-3 can be inhibited. The package body 40 also may be filled in the groove 16c.

Figure 3D:
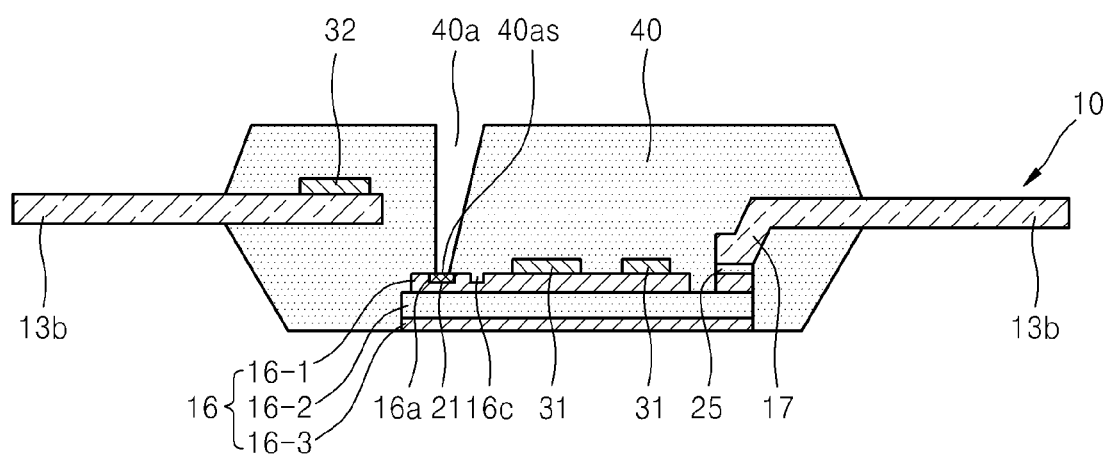

Referring to FIG. 3D, the upper and lower molds 51 and 52 and the support pin 53 included in the upper mold 51 are removed from the package body 40. Thus, a pinhole 40a is formed in the package body 40 to expose the insulating material 21. The external leads 13b protrude outside the package body 40.

The pinhole 40a is formed to correspond to the support pin 53 and have substantially the same shape as the support pin 53. Thus, a bottom surface 40as of the pinhole 40a may terminate at the insulating material 21. In this case, the insulating material 21 encloses the bottom surface 40as of the pinhole 40a. Thus, only the insulating material 21, but not the first die pad 16, is exposed in the pinhole 40a. As a result, the first die pad 16 can be externally insulated by the insulating material 21, even though the pinhole 40a is formed.

Figure 3E:
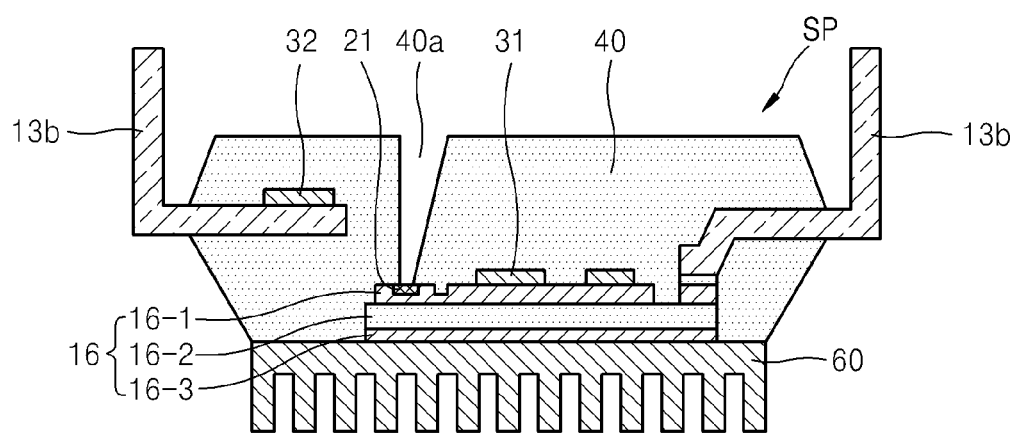

Referring to FIG. 3E, a trimming process may be performed to leave only the external leads 13b exposed outside the package body 40. Thereafter, a forming process of bending the external leads 13b may be performed, thereby completing fabrication of a semiconductor package SP.

Subsequently, a heat sink 60 may be installed on the lower surface of the first die pad 16. Specifically, the heat sink 60 may be disposed on the base metal layer 16-3 of the internal heat sink exposed outside the package body 40. In this case, there is no contaminant, such as a flash, on the lower surface of the base metal layer 16-3, and contact characteristics between the base metal layer 16-3 and the heat sink 60 can be improved. As a result, the semiconductor package SP can have good heat dissipation characteristics.

According to aspects of the present invention as described above, only an insulating material, but not a die pad, is exposed in a pinhole formed in a package body. As a result, even if the pinhole is formed, the die pad can be externally insulated by the insulating material. Also, the insulating material can protect a semiconductor chip from moisture and oxygen contained in the external air.

The packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A semiconductor package comprising:
   a first die pad including an upper surface, a lower surface, and a dimple, the dimple being located in a surface of the first die pad and being filled with an insulating material;
   a first semiconductor chip mounted on the upper surface of the first die pad; and
   a package body that encapsulates the first die pad and the first semiconductor chip, wherein the package body has a pinhole that terminates at the insulating material thereby protecting said semiconductor chip from any moisture and oxygen contained in the external ambient.

2. The semiconductor package of claim 1, wherein the insulating material comprises one or more of the following: an epoxy resin, a polyimide, a silicone.

3. The semiconductor package of claim 1, wherein the dimple filled with the insulating material is disposed in the upper surface of the first die pad, and
wherein the first die pad further includes a groove formed between the first semiconductor chip and the dimple.

4. The semiconductor package of claim 3, wherein the groove is filled with the package body.

5. The semiconductor package of claim 1, wherein the dimple is located at the upper surface of the first die pad,
wherein the first die pad further includes a lower dimple filled with a second insulating material in the lower surface thereof, and
wherein the package body includes an upper pinhole that terminates on the first insulating material and a lower pinhole that terminates on the second insulating material.

6. The semiconductor package of claim 1, wherein the first die pad includes an internal heat sink and an interconnection layer,
wherein the dimple is disposed in the interconnection layer, and
wherein the first semiconductor chip is mounted on the interconnection layer.

7. The semiconductor package of claim 1, wherein the first semiconductor chip comprises a power circuit chip.

8. The semiconductor package of claim 7, further comprising:
a second die pad disposed adjacent to the first die pad; and
a control circuit chip mounted on the second die pad and for controlling the power circuit chip.

9. The semiconductor package of claim 1, further comprising an external heat sink disposed adjacent to the lower surface of the first die pad.

10. A semiconductor package comprising:
a die pad including an upper dimple filled with a first insulating material in an upper surface thereof and a lower dimple filled with a second insulating material in a lower surface thereof;
a semiconductor chip mounted on the upper surface of the die pad and spaced apart from the upper dimple; and
a package body that encapsulates the die pad and the semiconductor chip and that includes an upper pinhole adjacent to the upper surface of the die pad and a lower pinhole adjacent to the lower surface of the die pad,
wherein a bottom surface of the upper pinhole terminates at the first insulating material, and wherein a bottom surface of the lower pinhole terminates at the second insulating material, thereby protecting said semiconductor chip from any moisture and oxygen contained in the external ambient.

11. The semiconductor package of claim 10, further comprising an external heat sink disposed adjacent to the package body and opposite to the lower surface of the die pad.

12. A semiconductor package comprising:
a die pad including an internal heat sink, an interconnection layer, and a dimple disposed in the interconnection layer and filled with an insulating material;
a semiconductor chip mounted on an upper surface of the die pad and spaced apart from the dimple; and
a package body that encapsulates the die pad and the semiconductor chip, and that includes a pinhole adjacent to the upper surface of the die pad,
wherein a bottom surface of the pinhole terminates at the insulating material thereby protecting said semiconductor chip from any moisture and oxygen contained in the external ambient, and the internal heat sink is exposed outside the package body.

13. The semiconductor package of claim 12, further comprising an external heat sink disposed on the exposed portion of the internal heat sink.

14. A method of fabricating a semiconductor package, the method comprising:
forming a dimple filled with an insulating material in an upper surface or a lower surface of a first die pad;
mounting a first semiconductor chip on the upper surface of the first die pad;
disposing the first die pad in a mold including a support pin such that an end surface of the support pin terminates at the insulating material;
injecting an encapsulant into the mold to form a package body that encapsulates the first semiconductor chip and the first die pad; and
separating the package body and the mold, including the support pin, from one another to form a pinhole in the package body that corresponds to the support pin of the mold, said pin hole being located over the insulating material, wherein the insulating material protects said semiconductor chip from any moisture and oxygen contained in the external ambient.

15. The method of claim 14, wherein the insulating material comprises one or more of the following: an epoxy resin, a polyimide, a silicone.

16. The method of claim 14, wherein the dimple filled with the insulating material is formed in the upper surface of the first die pad, and
wherein the method further comprises forming a groove in the upper surface of the first die pad between the first semiconductor chip and the dimple.

17. The method of claim 14, wherein an upper dimple filled with a first insulating material is formed in the upper surface of the first die pad, and a lower dimple filled with a second insulating material is formed in the lower surface of the first die pad,
wherein the mold includes a first support pin having an end surface terminating at the first insulating material and a second support pin having an end surface terminating at the second insulating material, and
wherein separating the package body and mold from one another forms an upper pinhole in the package body that corresponds to the first support pin and a lower pinhole in the package body that corresponds to the second support pin.

18. The method of claim 14, wherein the first die pad includes an internal heat sink and an interconnection layer,
wherein the dimple is formed in the interconnection layer and the first semiconductor chip is mounted on the interconnection layer, and
wherein the internal heat sink has an exposed portion that is not covered by the package body.

19. The method of claim 14, wherein the first semiconductor chip comprises a power circuit chip.

20. The method of claim 19, further comprising mounting a control circuit chip for controlling the power circuit chip on a second die pad disposed adjacent to the first die pad.

* * * * *